United States Patent
Bateman et al.

(10) Patent No.: US 7,373,036 B2
(45) Date of Patent: May 13, 2008

(54) SWITCHING DEVICE AND METHOD

(76) Inventors: David E. Bateman, 3681 Lake Harney Cir., Geneva, FL (US) 32732; Todd M. Bullock, 203 E. 10th St., Sanford, FL (US) 32771

( * ) Notice: Subject to any disclaimer, the term of this patent is extended or adjusted under 35 U.S.C. 154(b) by 59 days.

(21) Appl. No.: 11/380,070

(22) Filed: Apr. 25, 2006

(65) Prior Publication Data

US 2006/0245683 A1 Nov. 2, 2006

Related U.S. Application Data

(60) Provisional application No. 60/674,569, filed on Apr. 25, 2005.

(51) Int. Cl.
*G02B 6/26* (2006.01)
*G02B 6/35* (2006.01)

(52) U.S. Cl. .......................... 385/16; 385/19

(58) Field of Classification Search ............ 385/16–23; 359/233–266
See application file for complete search history.

(56) References Cited

U.S. PATENT DOCUMENTS

| | | |
|---|---|---|
| 4,376,566 A | 3/1983 | Blackington |
| 4,383,155 A | 5/1983 | Tenner |
| 4,437,728 A * | 3/1984 | Ohashi .................. 385/18 |
| 4,704,656 A | 11/1987 | Neiger |
| 4,831,253 A * | 5/1989 | Omura et al. ............. 250/229 |
| 5,004,318 A | 4/1991 | Ohashi |
| 5,090,791 A | 2/1992 | Kidder et al. |
| 5,105,059 A | 4/1992 | Sorenson et al. |
| 5,152,309 A | 10/1992 | Twerdochlib et al. |
| 5,212,744 A | 5/1993 | Ohnuki |
| 5,430,261 A * | 7/1995 | Malone .................. 200/1 B |
| 5,479,826 A | 1/1996 | Twerdochlib et al. |
| 5,780,795 A | 7/1998 | O'Reilly |
| 5,909,525 A | 6/1999 | Miller et al. |
| 5,930,417 A | 7/1999 | Wolfe et al. |
| 6,181,847 B1 | 1/2001 | Baker et al. |
| 6,448,548 B1 | 9/2002 | Doczy et al. |
| 6,634,898 B2 | 10/2003 | Clements |
| 2002/0167789 A1 | 11/2002 | Novin et al. |
| 2004/0046625 A1 * | 3/2004 | Fukushima et al. ......... 335/270 |
| 2006/0118707 A1 * | 6/2006 | Schaake ............... 250/231.13 |

FOREIGN PATENT DOCUMENTS

| | | |
|---|---|---|
| DE | 4336729 | 5/1995 |
| JP | 2065017 | 3/1990 |
| JP | 03178618 | 8/1991 |
| JP | 07218847 | 8/1995 |
| JP | 11344681 A * | 12/1999 |

* cited by examiner

*Primary Examiner*—Michelle R. Connelly-Cushwa
(74) *Attorney, Agent, or Firm*—Allen, Dyer, Doppelt, Milbrath & Gilchrist, P.A.

(57) ABSTRACT

A rocker styled switch includes an arm member moveable into and out of a beam path transmitting light between an optical transmitter and an optical receiver for blocking and allowing light to reach the receiver for providing an actuating signal. An end of the arm member includes a cam follower moveable along a contoured cam surface for causing a preferential movement of the arm member from an unstable position to a stable position responsive to the cam surface for defining a switching operation. Interchangeable cam surfaces provide a one position momentary switch, a two position momentary switch, a two position stationary switch, and a three position stationary switch.

28 Claims, 7 Drawing Sheets

SWITCHING DEVICE AND METHOD

CROSS-REFERENCE TO RELATED APPLICATIONS

This application claims the benefit of U.S. Provisional Application No. 60/674,569 for "Switching Device and Method" having filing date Apr. 25, 2005, the disclosure of which is incorporated herein by reference in its entirety, and commonly owned.

FIELD OF THE INVENTION

The present invention generally relates to switches and in particular to a switch for providing selectable switching including momentary and stationary switching modes.

BACKGROUND OF THE INVENTION

Typical rocker and toggle switches known in the art use a plunger to move electrical contacts into different positions to create a signal for activating and de-activating an electrical device connected to the switch. It is well known to those skilled in the art that problems result when electrical contacts corrode over time, thus preventing the switch from functioning as desired. By way of example, while switches actuated by a rocker member are widely used for user remote control in various hostile environments such as automotive and boating vehicle accessories, they continue to be fabricated using metal contacts, such as described in U.S. Pat. No. 5,105,059 to Sorenson et al. As addressed in U.S. Pat. No. 5,430,261 to Malone, in certain switch applications, it is desirable to provide actuation of multiple switches by user movement of the actuation rocker member in one direction. This type of sequential plural switch actuation has been employed in applications where it is desirable to provide an automatic down or lowering function for powered window motors, by way of example, to permit user relaxation of the switch rocker yet provide continuous downward movement of the window to its lower opening limit. Upon user movement of the switch rocker actuator member to a rotated position in such systems, a motor is energized, so long as the user maintains the rocker in that position the motor will continue running. It is further desirable to have a variety of switching operations that may include single and double momentary switching or stationary switches. There is further a need to provide ease in modifying a rocker styled switch for the desired switching operation.

SUMMARY OF THE INVENTION

According to the teachings of the present invention, a switch may comprise an arm member movable by a cam and an actuator operable with the arm member responsive to movement of the arm member by the cam. The arm member may be pivotally connected to a base. A distal end of the arm member may be biased against a cam surface of the cam for slidable movement therealong. Further, the arm member distal end may include a cam follower operable with the cam surface, wherein the cam follower preferentially moves from an unstable condition on the cam surface to a stable condition thereon for defining a switching operation.

The cam may comprise a cam surface having a contoured portion with at least one of a convex surface and a concave surface for providing at least one of the stable position and the unstable position for the arm member, and wherein the preferential movement of the arm member along the contoured portion results in a switch including at least one of a one position momentary switch, a two position momentary switch, a two position stationary switch, and a three position stationary switch.

The cam surface may comprise an arcuate surface having a first contoured portion and a second contoured portion, the second contoured portion further spaced from the arm member than the first contoured portion for causing the cam follower to move from the first to the second contoured portion through a biasing on the cam surface, the second contoured surface having a stop for providing the stable position, thus providing a one position momentary switch. The cam surface may comprise an arcuate surface having a central portion and opposing first and second portions, the central portion further spaced from the arm member than the opposing first and second portions for causing the cam follower to move from the first and the second portions to the central portion through a biasing on the cam surface, wherein the first and second portions providing the unstable condition and the central position provides the stable condition, thus providing a two position momentary switch. The cam surface may comprise an arcuate surface having a first contoured portion and second and third contoured portions on opposing sides of et first contoured portion, the second and third contoured portions being further spaced from the arm member than the first contoured portion for causing the cam follower to move from the first to at least one of the second and third contoured portions through a biasing on the cam surface, the second and third contoured portions further spaced from the arm member for providing the stable position, thus providing a two position stationary switch, or may further comprise fourth and fifth contoured portions, the fifth contoured portion further spaced from the arm member than the fourth contoured portion for causing the cam follower to move from the fourth to the fifth contoured portion through a biasing on the cam surface, thus providing a three position stationary switch.

A switch according to the teachings of the present invention may include an optical transmitter for transmitting light along a path and an optical receiver positioned within the path for providing an actuating signal responsive to the light from the optical transmitter, wherein an arm member is movable between a blocking position when in the path to an unblocking position when removed from the path. The switch may further include a printed circuit board, wherein the optical transmitter and optical receiver are carried by and operable with circuitry on the printed circuit board. The printed circuit board may be removably secured to a base by a portion of the cam.

A switch may further include a button carried by a proximal end of an arm member with the button positioned for manual operation thereof. Yet further, the button may comprise an elongate member attached to the arm member proximal end at a central portion there, and wherein a pressing on opposing end portions of the elongate member provides a levering action on the arm member.

BRIEF DESCRIPTION OF THE DRAWINGS

Embodiments of the invention are described by way of example with reference to the accompanying drawings in which.

DETAILED DESCRIPTION OF THE PREFERRED EMBODIMENTS

The present invention will now be described more fully hereinafter with reference to the accompanying drawings, in which embodiments of the invention are shown by way of illustration and example. This invention may, however, be embodied in many forms and should not be construed as limited to the embodiments set forth herein. Rather, these embodiments are provided so that this disclosure will be thorough and complete, and will fully convey the scope of the invention to those skilled in the art.

Figure 1:
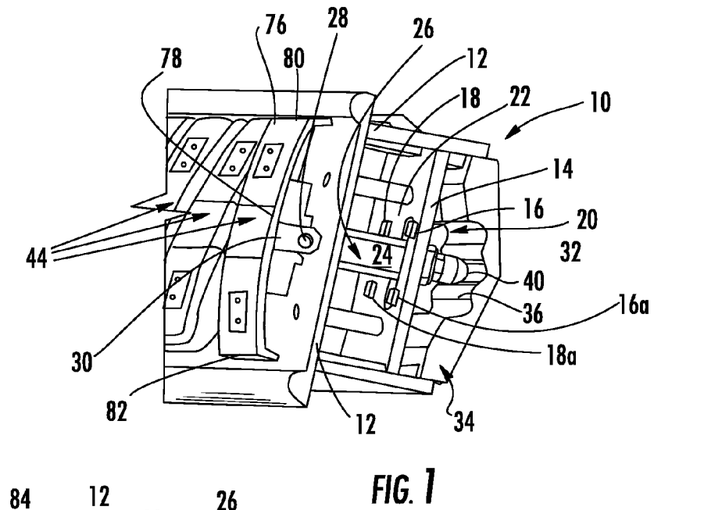
FIGS. 1-3 are partial cut-away perspective views illustrating a switch according to the teachings of the present invention having an arm member is actuating and non-actuating switch positions.

With reference initially to FIG. 1, one embodiment of the present invention may include a switch 10 having a base 12. A printed circuit board 14 is carried by the base 12 with an optical transmitter 16 and an optical receiver 18 carried by the printed circuit board. For the embodiment herein described, by way of example, the optical transmitter 16 and optical receiver 18 form part of an actuator 20 operable for emitting light along a beam path 22 wherein the optical receiver 18 is positioned within the beam path for receiving the light emitted from the optical transmitter. He actuator 20 provides an actuating signal responsive to the light being received by the receiver 18 or blocked by an opaque central portion 24 of an arm member 26, as illustrated with reference to FIG. 2. For the embodiment herein described by way of example, the arm member 26 is pivotally connected to the base 12 by a pivot pin 28, wherein movement of a proximal end 30 of the arm member 26 results in a distal end 30 moving into and out of the beam path 22 resulting in the blocking and an unblocking of the light transmitted to the optical receiver 18.

Figure 2:
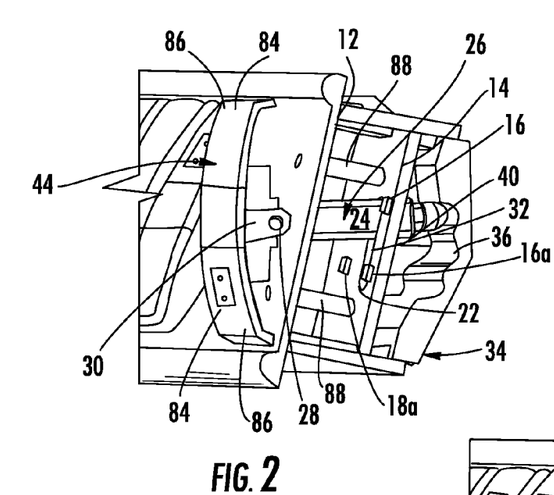
Figure 3:
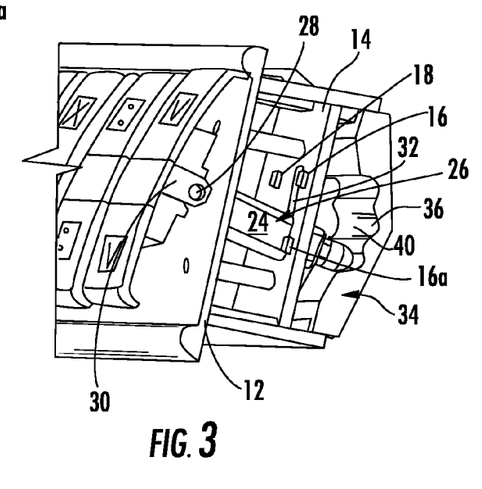

As illustrated with again to FIGS. 1 and 2, and to FIG. 3, The actuator 20 for the embodiment herein described, includes the transmitter and receiver 16, 18, as well as a second transmitter and receiver 16a, 18a, providing a second beam path 22a, the transmitters ad receivers carried by the printed circuit board 14. With continued reference to FIGS. 1-3, the printed circuit board 14 further includes a slot 32, wherein the optical transmitters 16, 16a and the optical receivers 18, 18a are carried on the printed circuit board on opposing sides of the slot, and wherein the arm member 26 extends into and is moveable into and out of the beam paths 22, 22a.

With continued reference to FIGS. 1-3, the switch 10 includes a cam 34 carried by the base 12 with the cam herein described as including a cam surface 36. A cam follower 38 is carried by the arm member distal end 30. The cam follower 38 is biased for slidable movement against the cam surface 36. By way of example, the cam follower 38, herein described by way of example, includes a spring loaded plunger 40 extending from a cavity within the arm member distal end 30. Various other cam followers useful with embodiments of the invention will come to those of skill in the art, now having the benefit of the teachings of the present invention.

Figure 4:
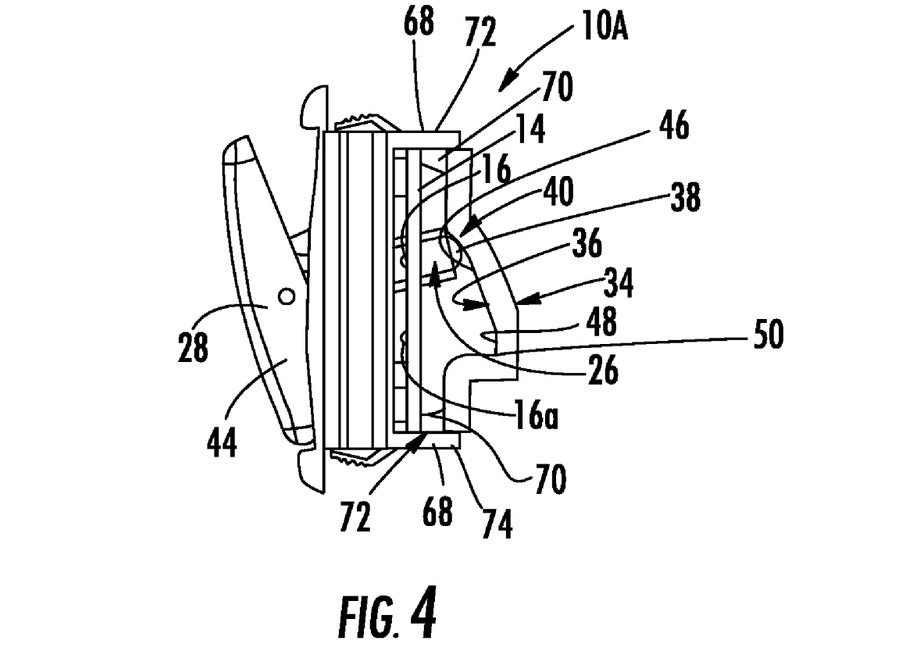
FIGS. 4 and 5 are partial side views of a one position momentary switch according to the teachings of the present invention.
Figure 5:
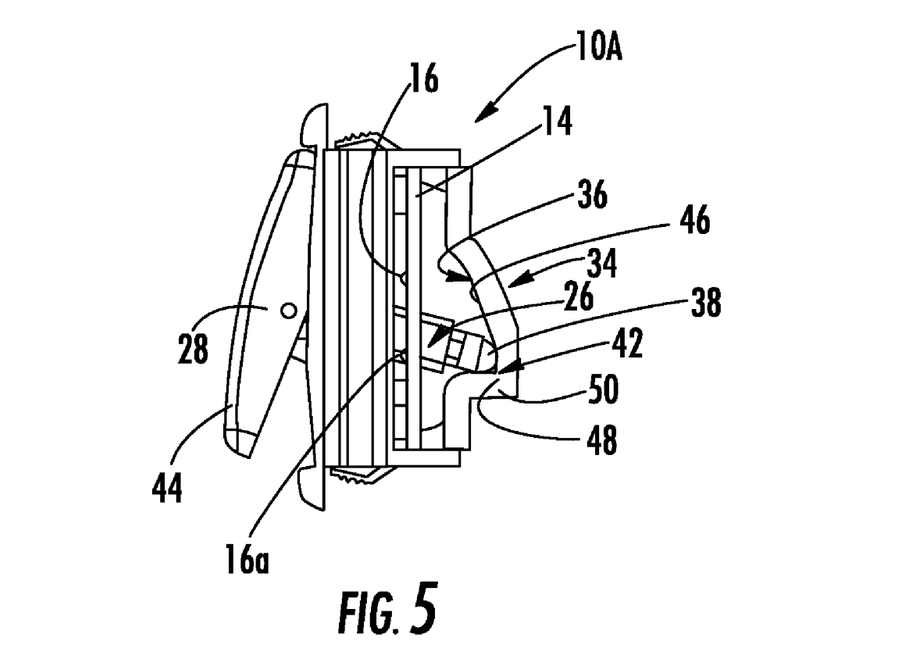

With reference now to FIGS. 4 and 5, the cam follower 38 will preferentially move from an unstable position or condition 40 on the cam surface 36 to a stable position or condition 42 on the cam surface 36 resulting from a movement of the arm member proximal end 30 for defining a switching operation responsive to a movement of a button 44 carried at the arm member proximal end 30. The cam surface 36 illustrated with reference to FIGS. 4 and 5, is herein described as comprising an arcuate surface having a first contoured portion 46 and a second contoured portion 48, the second contoured portion further spaced from the pivot pin 28 of the arm member 26 than the first contoured portion for causing the cam follower 38 to move from the first to the second contoured portion through a biasing on the cam surface 36. The second contoured surface having a stop 50 for providing the stable position 42, thus providing a one position momentary switch 10A.

Figure 6:
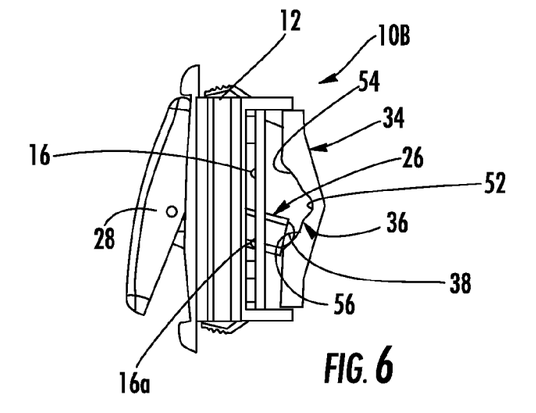
FIGS. 6-8 are partial side views of a two position momentary switch according to the teachings of the present invention.
Figure 7:
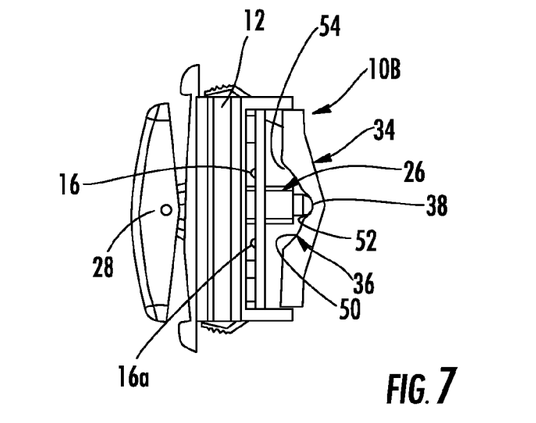
Figure 8:
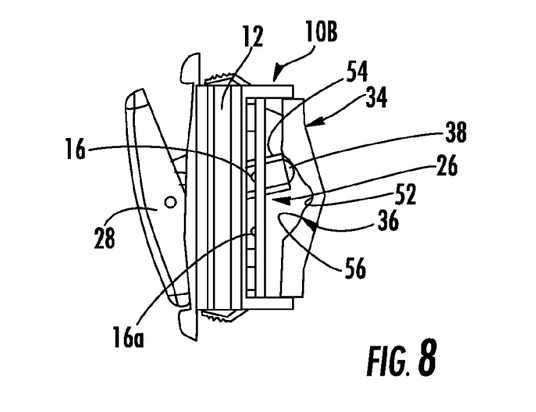

A two position momentary switch 10B, as illustrated with reference to FIGS. 6-8, wherein the cam surface 36 comprises an arcuate surface having a central portion 52 and opposing first and second portions 54, 56, the central portion being further spaced from the pivot pin 28 of the arm member 26 than the opposing first and second portions for causing the cam follower 38 to move from the first and the second portions to the central portion through a biasing on the cam surface. The first and second portions 54, 56 provide the unstable condition 40 and the central position provides the stable condition 42, thus providing the two position momentary switch 10B.

Figure 9:
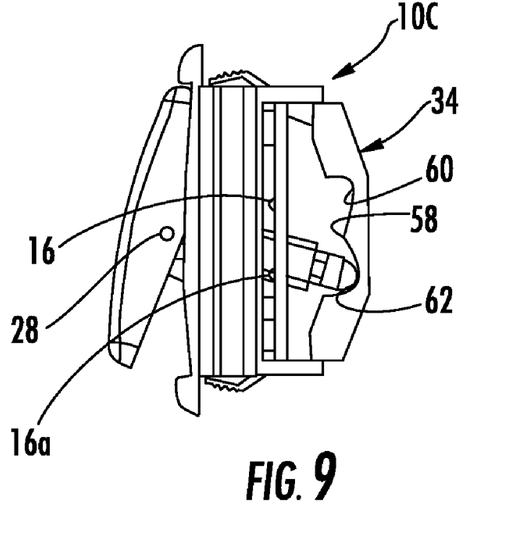
FIGS. 9 and 10 are partial side views of a two position stationary switch according to the teachings of the present invention.
Figure 10:
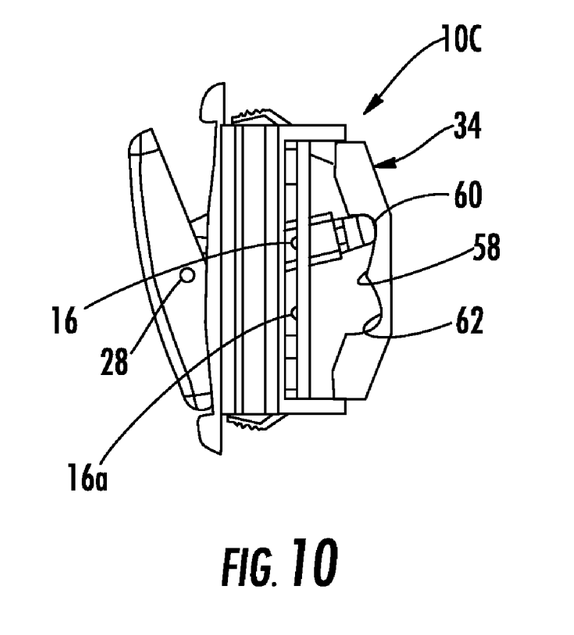
Figure 11:
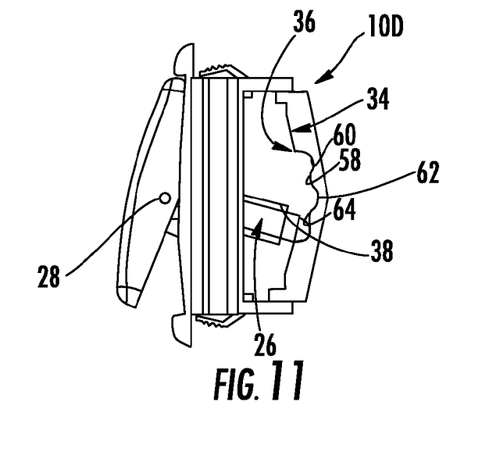
FIGS. 11-13 partial side views of a three position stationary switch according to the teachings of the present invention.
Figure 12:
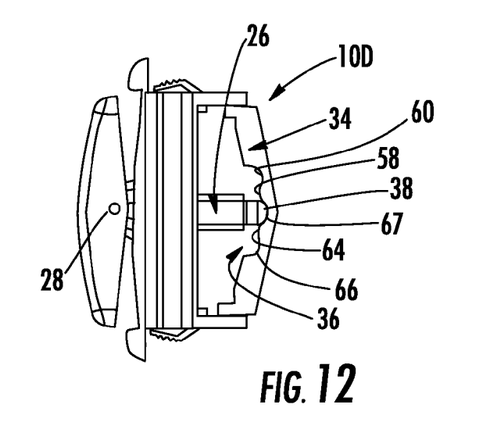
Figure 13:
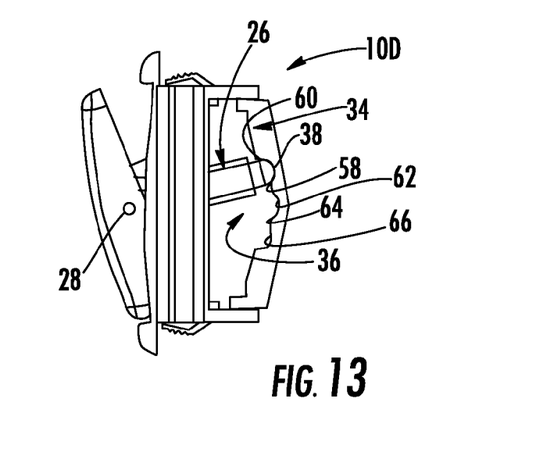
Figure 14:
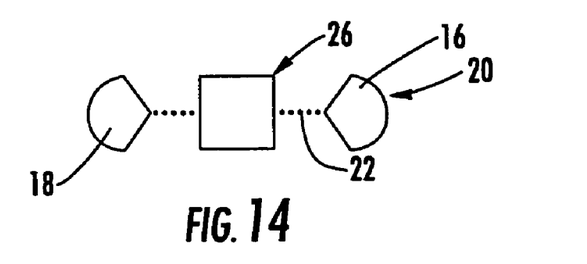
FIGS. 14-17 are diagrammatical illustrations of actuators operable in embodiments of invention including electro-optical, electromagnetic, electrical contacting, ad mechanical actuators.
Figure 15:
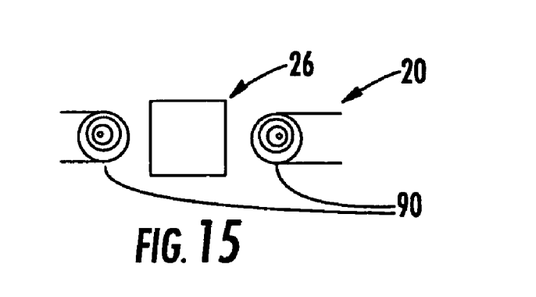
Figure 16:
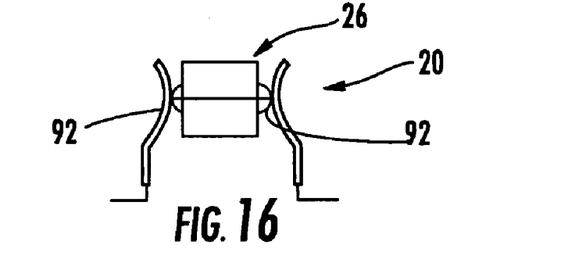
Figure 17:
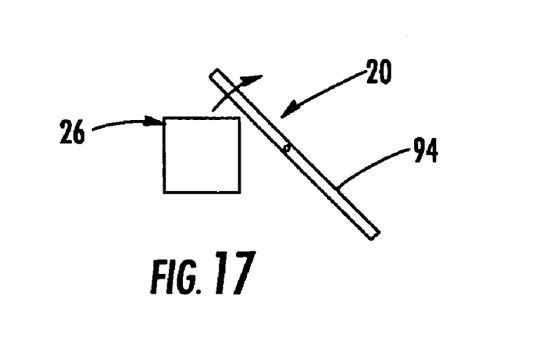

Stationary switches are provided in alternate embodiments. By way of example with regard to FIGS. 9 and 10, a two position stationary switch 10C is herein described as having the cam surface 36 having a first contoured portion 58 and second and third contoured portions 60, 62 on opposing sides of the first contoured portion. The second and third contoured portions 60, 62 being further spaced from the pivot pin 28 of the arm member 26 than the first contoured portion 58 for causing the cam follower 38 to move from the first to at least one of the second and third contoured portions through a biasing on the cam surface 36. The second and third contoured portions 60, 62 are further spaced from the pivot pin 28 for providing the stable position 42, thus providing the two position stationary switch 10C. As further illustrated with reference to FIGS. 9 and 10, the first contoured portion 58 is convex and the second and third portions 60, 62 are concave. As illustrated with reference to FIGS. 11-13, a three position stationary switch 10D may be provided and is herein described as further including fourth and fifth contoured portions 64, 66, the fifth contoured portion being further spaced from the pivot pin 28 than the fourth contoured portion for causing the cam follower 38 to move from the fourth to the fifth contoured portion through a biasing on the cam surface 36. The fourth contoured portion 64 is convex and the fifth contoured portion 66 is concave.

As will come to the mind of those skilled in the art, now having the benefit of the teachings of et present invention, various other switching operations may be configured based on the cam surface and the positioning o the actuators, by way of example. Generally, the cam surfaces may comprises contoured portions, angles portions, slopes, and the like for providing stable and unstable positions for preferential movement of the arm member along the cam surface resulting in momentary or stationary switches.

With reference again to FIG. 4, by way of example, the cam 34 comprises a tab 68 on a leg portion 70 thereof operable with a notch 72 within a leg portion 74 of the base 12 for providing snap-fit of the cam onto the base. The cam 34 is biased against the printed circuit board 14 for securing the printed circuit board to the base.

With reference again to FIG. 1, by way of example, the button 44 carried by the arm member proximal end 30, the button is positioned for a manual operation. The button 44 comprises an elongate member 76 attached to the arm member proximal end 30 at a central portion 78 of the elongate member. By pressing on opposing end portions 80, 82 of the elongate member 76 a levering action, or rocker action, is provided to the arm member, as is typical for rocker styled switches. As illustrated with reference again to FIG. 2, icons 84 may be carried on a light permeable surface portion 86 of the button 44 with the icons back-lighted using a light pipe 88 extending from proximate a light source to proximate the light permeable surface 86 of the button 44.

As illustrated with reference to FIGS. 14-17, while an electro-optical actuation device 90 is herein above described, by way of example for the benefits derived when used in a hostile environment such as the salt air surrounding boats, various actuating mechanisms will come to the mind of those skilled in the art, now having the benefit of the teachings of the present invention. As illustrated with reference to FIG. 14, the actuator 20 may include the arm 26 interrupting the beam path 22, as above described, but may also include the arm 26 having magnetic properties for actuating coils 90, as illustrated with reference to FIG. 15. Yet further, the arm 26 may be electrically conductive for making and breaking connection to contacts 92, as illustrated with reference to FIG. 16, and alternatively may make mechanical contact with an element such as a lever 94, as illustrated with reference to FIG. 17.

Figure 18:
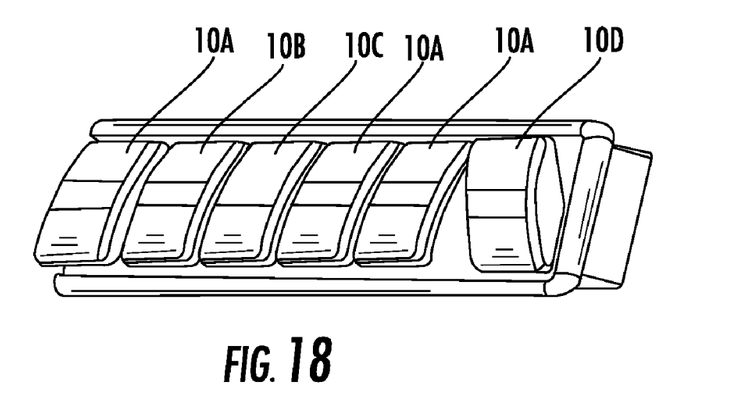
FIG. 18 is a top perspective view illustrating multiple banked switches.
Figure 19:
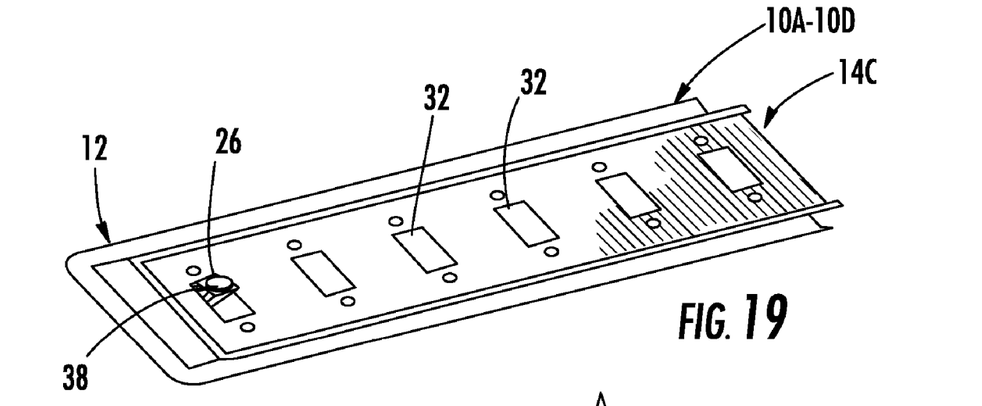
FIG. 19 is a partial rear perspective view of the embodiment of FIG. 18 illustrating use of a single printed circuit board with the multiple switches.
Figure 20:
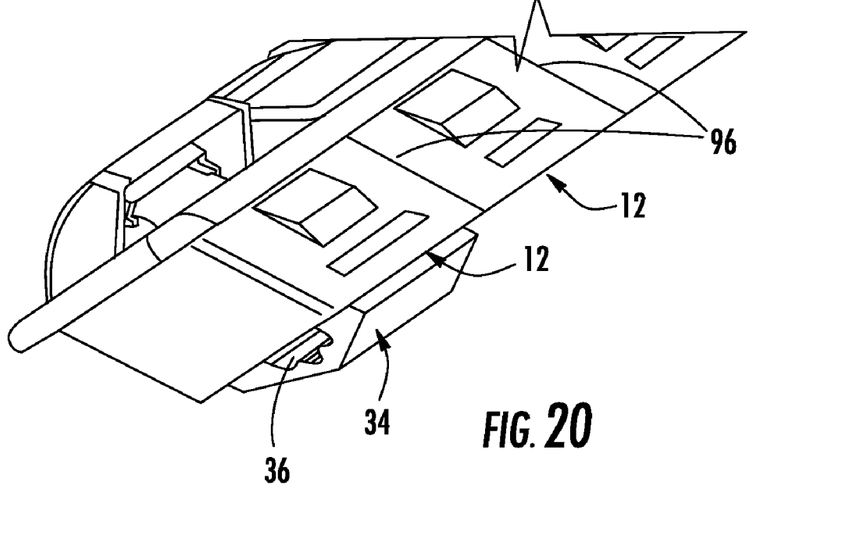
FIG. 20 is a partial enlarged side perspective view illustrating a connection between switches.

As illustrated with reference to FIG. 18, multiple switches 10A-10D may be connected together for mounting to a console. Yet further, the embodiments of the invention herein described by way of example, may further include a single printed circuit board 14C with the bases 12 connected through a dove tail arrangement 96, as illustrated with reference to FIGS. 19 and 20.

Although the invention has been described relative to specific embodiments thereof, there are numerous variations and modifications that will be readily apparent to those skilled in the art in light of the above teachings. It is therefore to be understood that, within the scope of the appended claims, the invention may be practiced other than as specifically described.

That which is claimed is:

1. A switch comprising:
    a base;
    an arm member movably carried by the base;
    a cam surface operable with the arm member for limiting movement thereof, wherein the cam surface provides a stable condition and an unstable condition for the arm member; and
    an actuator responsive to movement of the arm member, wherein a preferential free movement of the arm member along the cam surface results in at least one of a momentary switch and a stationary switch.

2. A switch according to claim 1, wherein the arm member is pivotally connected to the base.

3. A switch according to claim 1, wherein a distal end of the arm member is biased against the cam surface for slidable movement therealong.

4. A switch according to claim 3, wherein the arm member distal end comprises a cam follower operable with the cam surface.

5. A switch according to claim 4, wherein the cam follower preferentially moves from the unstable condition on the cam surface to a stable condition thereon for defining a switching operation.

6. A switch according to claim 5, wherein the cam surface comprises an arcuate surface having a first contoured portion and a second contoured portion, the second contoured portion sufficiently spaced from the arm member for causing the cam follower to move from the first to the second contoured portion through a biasing on the cam surface, and wherein a stop is provided proximate the second contoured surface for receiving the arm member distal end thereagainst, thus providing a one position momentary switch.

7. A switch according to claim 5, wherein the cam surface comprises an arcuate surface having a central portion and opposing first and second portions, the central portion sufficiently spaced from the arm member for causing the cam follower to move from the first and the second portions to the central portion through a biasing on the cam surface, wherein the first and second portions provide the unstable condition and the central position provides the stable condition, thus providing a two position momentary switch.

8. A switch according to claim 7, wherein the central portion of the arcuate surface is convex, and wherein the opposing first and second portions are concave.

9. A switch according to claim 5, wherein the cam surface comprises an arcuate surface having a first contoured portion and second and third contoured portions on opposing sides of the first contoured portion, the second and third contoured portions sufficiently spaced from the arm member for causing the cam follower to move from the first to at least one of the second and third contoured portions through a biasing on the cam surface, the second and third contoured portions sufficiently spaced from the arm member for providing the stable condition, thus providing a two position stationary switch.

10. A switch according to claim 9, wherein the first contoured portion of the arcuate surface is convex, and wherein the second and third portions are concave.

11. A switch according to claim 9, wherein the cam surface further comprises fourth and fifth contoured portions, the fifth contoured portion sufficiently spaced from the arm member for causing the cam follower to move from the fourth to the fifth contoured portion through a biasing on the cam surface, thus providing a three position stationary switch.

12. A switch according to claim 11, wherein the fourth contoured portion is convex, and wherein the fifth contoured portion is concave.

13. A switch according to claim 1, wherein the actuator comprises:
    an optical transmitter for transmitting light along a path; and
    an optical receiver positioned within the path for providing an actuating signal responsive to the light from the optical transmitter, wherein the arm member is movable between a blocking position when in the path to an unblocking position when removed from the path.

14. A switch according to claim 13, further comprising a printed circuit board carried by the base, wherein the optical transmitter and optical receiver are carried by the printed circuit board.

15. A switch according to claim 14, wherein the printed circuit board is removably secured to the base by a biasing of the cam surface thereagainst.

16. A switch according to claim 1, wherein the actuator comprises:
a first actuator having a first optical transmitter for transmitting a first light along a first path, and a first optical receiver positioned within the first path for providing a first actuating signal responsive to the first light from the first optical transmitter; and
a second actuator having a second optical transmitter for transmitting light along a second path, and a second optical receiver positioned within the second path for providing a second actuating signal responsive to the second light from the second optical transmitter,
wherein the arm member is movable within a plane including the first and second paths for interrupting the first and second light and thus affecting the first and second actuating signals.

17. A switch according to claim 16, wherein the arm member is movable between the first and second paths for blocking the first and second light transmitted to the first and second optical receivers.

18. A switch according to claim 1, further comprising a button carried by a proximal end of the arm member, the button positioned for manual operation thereof for initiating the movement of the arm member.

19. A switch according to claim 18, wherein the button comprises an elongate member attached to the arm member proximal end at a central portion thereof, and wherein a pressing on opposing end portions of the elongate member provides a levering action on the arm member.

20. A switch comprising:
an optical transmitter and an optical receiver, the optical transmitter operable for directing light along a light path to the optical receiver, the optical receiver responsive to the light for providing an actuating signal;
an arm member moveable into and out of the light path resulting in a blocking and an unblocking of the light to the optical receiver, thus affecting the actuating signal;
a cam operable with the arm member for movement thereof, wherein the arm member preferentially moves from an unstable position to a stable position responsive to the cam for defining a switching operation; and
a printed circuit board having a slot therein, wherein the optical transmitter and optical receiver are carried by the printed circuit board on opposing sides of the slot, and wherein the arm member is moveable within the slot.

21. A switch according to claim 20, further comprising a base, wherein a tab extends from the cam, and wherein the printed circuit board is secured to the base by a biasing of the cam against the base with the cam secured to the base by the tab.

22. A switch comprising:
an optical transmitter and an optical receiver, the optical transmitter operable for directing light along a light path to the optical receiver, the optical receiver responsive to the light for providing an actuating signal;
an arm member moveable into and out of the light path resulting in a blocking and an unblocking of the light to the optical receiver, thus affecting the actuating signal; and
a cam operable with the arm member for movement thereof, wherein the arm member preferentially moves from an unstable position to a stable position responsive to the cam for defining a switching operation,
wherein the cam comprises a cam surface having a contoured portion, the contoured portion having at least one of a convex surface and a concave surface for providing at least one of the stable position and the unstable position for the arm member, and wherein the preferential movement of the arm member along the contoured portion results in a switch including at least one of a one position momentary switch, a two position momentary switch, a two position stationary switch, and a three position stationary switch.

23. A switch comprising:
a base;
at least one optical transmitter carried by the base, the at least one optical transmitter operable for emitting at least one light along at least one beam path;
at least one optical receiver positioned within the at least one beam path for receiving the light emitted from the transmitter, the optical receiver providing an actuating signal response to the at least one light;
an arm member pivotally connected to the base, wherein movement of a proximal end thereof results in a distal end movement into and out of the at least one beam path resulting in a deflecting of the at least one light to the at least one optical receiver;
a cam carried by the base, the cam having a cam surface thereon;
a cam follower carried by the arm member distal end, the cam follower biased against the cam surface for slidable movement therealong, wherein the cam follower preferentially moves from an unstable position on the cam surface to a stable position thereon responsive to movement of the arm member proximal end for defining a switching operation, wherein the cam comprises snap-fit means securing the cam to the base; and
a printed circuit board carried by the base, wherein the cam is biased against the printed circuit board for a securing thereof to the base through the snap-fit means.

24. A switch according to claim 23, wherein the printed circuit board includes a slot, and wherein the at least one optical transmitter and the at least one optical receiver are positioned on opposing sides of the slot with the arm member moveable within the slot for having an intermediate portion thereof moveable into and out of the at least one beam path.

25. A switch comprising:
a base;
at least one optical transmitter carried by the base, the at least one optical transmitter operable for emitting at least one light along at least one beam path;
at least one optical receiver positioned within the at least one beam path for receiving the light emitted from the transmitter, the optical receiver providing an actuating signal response to the at least one light;
an arm member pivotally connected to the base, wherein movement of a proximal end thereof results in a distal end movement into and out of the at least one beam path resulting in a deflecting of the at least one light to the at least one optical receiver;

a cam carried by the base, the cam having a cam surface thereon;

a cam follower carried by the arm member distal end, the cam follower biased against the cam surface for slidable movement therealong, wherein the cam follower preferentially moves from an unstable position on the cam surface to a stable position thereon responsive to movement of the arm member proximal end for defining a switching operation, wherein the cam surface comprises a contoured portion having at least one of a convex surface and a concave surface for providing at least one of the stable position and the unstable position for the arm member, and wherein the preferential movement of the arm member along the contoured portion results in a switch including at least one of a one position momentary switch, a two position momentary switch, a two position stationary switch, and a three position stationary switch.

26. A switch comprising:

a base;

at least one optical transmitter carried by the base, the at least one optical transmitter operable for emitting at least one light along at least one beam path;

at least one optical receiver positioned within the at least one beam path for receiving the light emitted from the transmitter, the optical receiver providing an actuating signal response to the at least one light;

an arm member pivotally connected to the base, wherein movement of a proximal end thereof results in a distal end movement into and out of the at least one beam path resulting in a deflecting of the at least one light to the at least one optical receiver;

a cam carried by the base, the cam having a cam surface thereon;

a cam follower carried by the arm member distal end, the cam follower biased against the cam surface for slidable movement therealong, wherein the cam follower preferentially moves from an unstable position on the cam surface to a stable position thereon responsive to movement of the arm member proximal end for defining a switching operation;

a button carried by the arm member proximal end, the button positioned for a manual operation thereof; and an icon carried on a light permeable surface portion of the button, and wherein the icon is back-lighted.

27. A switch according to claim 26, wherein the button comprises an elongate member attached to the arm member proximal end at a central portion thereof, and wherein a pressing on opposing end portions of the elongate member provides a levering action on the arm member.

28. A switch according to claim 26, further comprising:

a light source; and a light pipe extending from proximate the light source to proximate the light permeable surface of the button.

* * * * *